United States Patent [19]
Weiler et al.

[11] Patent Number: 5,390,472
[45] Date of Patent: Feb. 21, 1995

[54] CARRIER TAPE WITH COVER STRIP

[75] Inventors: Joseph E. Weiler, Colfax; Dale R. Tidemann; Timothy J. Juntunen, both of Eau Claire, all of Wis.

[73] Assignee: Minnesota Mining and Manufacturing Company, St. Paul, Minn.

[21] Appl. No.: 190,888

[22] Filed: Feb. 3, 1994

Related U.S. Application Data

[63] Continuation-in-part of Ser. No. 900,423, Jun. 19, 1992, Pat. No. 5,325,654.

[51] Int. Cl.⁶ .............................................. B65D 73/02
[52] U.S. Cl. ................................... 53/412; 53/133.8; 53/492; 206/332; 428/43
[58] Field of Search .............. 206/332, 328, 334, 484; 53/412, 492, 471, 133.8, 133.6, 133.3, 553; 428/43

[56] References Cited

U.S. PATENT DOCUMENTS

| | | | |
|---|---|---|---|
| 4,450,959 | 5/1984 | Sommer | 206/332 |
| 4,606,171 | 8/1986 | Ohshima et al. | 53/397 |
| 4,708,245 | 11/1987 | Boeckmann et al. | 206/332 |
| 4,733,778 | 3/1988 | Boeckmann et al. | 206/332 |
| 4,736,841 | 4/1988 | Kaneko et al. | 206/332 |
| 4,781,953 | 11/1988 | Ball | 428/38 |
| 4,842,135 | 6/1989 | Borst et al. | 206/328 |
| 4,844,258 | 7/1989 | Boeckmann et al. | 206/328 |
| 4,898,275 | 2/1990 | Skrtic et al. | 206/330 |
| 4,944,979 | 7/1990 | Gagliano et al. | 428/43 |
| 4,958,053 | 9/1990 | Boeckmann et al. | 206/330 |
| 4,963,405 | 10/1990 | Yamashita et al. | 428/40 |
| 5,005,275 | 4/1991 | Borst et al. | 29/235 |
| 5,064,064 | 11/1991 | Itou et al. | 206/330 |

FOREIGN PATENT DOCUMENTS

| | | | |
|---|---|---|---|
| 0466937 | 1/1992 | European Pat. Off. | B65D 73/02 |
| 8804458 | 7/1988 | Germany | B65D 85/30 |
| 2-57575 | 2/1990 | Japan | B65D 73/02 |
| 4173559 | 6/1992 | Japan | B65D 63/10 |
| 4-311464 | 11/1992 | Japan | B65D 63/10 |
| 5-51053 | 3/1993 | Japan | B65D 73/02 |
| 2083001 | 7/1984 | United Kingdom | B65D 73/02 |

OTHER PUBLICATIONS

R. Prasad, Surface Mount Technology: Principles and Practice, pp. 190–192 (1989).
Research Disclosure No. 29060 (Anonymous), Jun. 1988.

*Primary Examiner*—James F. Coan
*Attorney, Agent, or Firm*—Gary L. Griswold; Walter N. Kirn; Steven E. Skolnick

[57] ABSTRACT

A carrier tape and cover strip are provided for storing electronic components and for supplying those components seriatim to a machine. The carrier tape includes a strip portion having spaced longitudinal edge surfaces, and a plurality of pockets formed in the strip portion. The cover strip is applied over the pockets to contain electronic components therein, and is bonded along two outer bonding portions to the edge surfaces of the carrier tape. The cover strip includes a pair of longitudinal tear lines which enable progressive separation of a medial portion of the cover strip overlying the pockets from the bonding portions to expose the contents of the pockets. In one embodiment, the cover strip includes nicks in the bonding portions thereof for providing a predetermined direction of tear in the bonding portions to initiate a tear along each of said longitudinal tear lines when said cover strip is removed from said top surface.

20 Claims, 5 Drawing Sheets

CARRIER TAPE WITH COVER STRIP

CROSS REFERENCE TO RELATED APPLICATION

This is a continuation-in-part application of Ser. No. 07/900,423, filed Jun. 19, 1992, now U.S. Pat. No. 5,325,654.

TECHNICAL FIELD

This invention relates to a carrier tape for storing electronic surface mount components and for supplying those components seriatim to a machine. The carrier tape includes a cover strip for covering the individual pockets of the carrier tape.

BACKGROUND OF THE INVENTION

In the field of electronic circuit assembly, electronic components are often carried from a supply of such components to a specific location on a circuit board for attachment thereto. The components may be of several different types, including surface mount components and through-hole components. Specifically, these components may include, but are not limited to such things as memory chips, resistors, connectors, dual in-line processors (DIPS), capacitors and gate arrays. These and other components are typically affixed to a circuit board that may later be incorporated into an electronic device.

Rather than manually affixing each individual electronic component to a circuit board, the electronics industry makes extensive use of robotic placement machines, sometimes known as "pick-and-place" machines, which grasp a component at a specific location (the supply) and place it at another specific location (the circuit board). To ensure the sustained operation of such robotic placement machines, a continuous supply of electronic components must be furnished to the machine at a predetermined location in order that the robotic placement machine may be programmed to repeat a precise sequence of movements during every cycle. It is therefore important that each such component be located in the same position (i.e. the point at which the robotic placement machine grasps the component) as each preceding and succeeding component.

One way to provide a continuous supply of electronic components to a desired location is to load a series of such components into pockets that are spaced along a carrier tape. The loaded carrier tape, which is usually provided in roll form, may then be advanced toward the pick-up location at a predetermined rate as each succeeding component is removed from the tape by the robotic placement machine. Conventional carrier tapes generally comprise a self-supporting lower portion that carries the component, and a flexible cover strip that aids in preventing foreign matter from deleteriously affecting the component. The cover strip is typically bonded to the lower portion, and is progressively peeled away from the lower portion just before the robotic placement machine removes the component from the carrier tape. Alternately, a rigid reusable cover strip may be used, such as that described in U.S. Pat. Nos. 4,733,778, 4,842,135, 4,844,258, 4,958,053, and 5,005,275.

Figure 1:
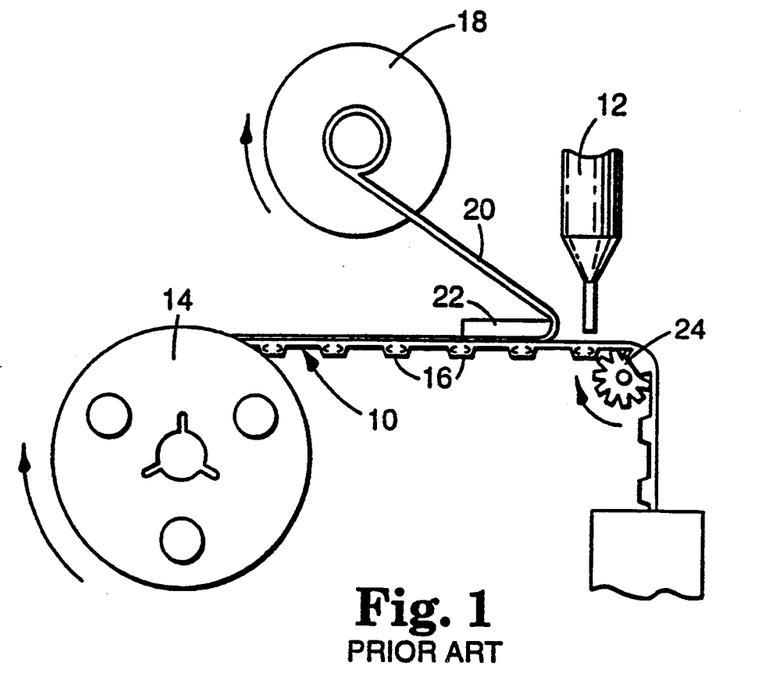
FIG. 1 is a schematic representation of a conventional carrier tape and placement machine.

FIG. 1 illustrates a conventional carrier tape 10 in combination with a robotic placement machine 12. A supply roll 14 provides carrier tape 10 having an aligned plurality of regularly spaced pockets 16, each of which is loaded with an electronic component. A stripper assembly 18 peels the cover strip 20 from carrier tape 10 around a stripper block 22, which assists in preventing stripper assembly 18 from pulling carrier tape 10 away from its designated path. Carrier tape 10 is advanced by a sprocket 24, which engages advancement holes along at least one outer edge surface of carrier tape 10 to advance carrier tape toward robotic placement machine 12. As each successive component reaches the desired pick-up point, the robotic placement machine grasps the component (either manually or by suction) and places it on a circuit board in the appropriate location.

Electronic components may be formed by encapsulating an integrated circuit within a plastic compound. However, if the component contains entrained moisture, cracking can occur when the component is later heated for soldering to a circuit board. It is therefore desirable to remove as much entrained moisture as possible from the component in order to minimize the possibility of cracking. Moisture removal is usually done by baking or drying the components in an oven to evaporate the entrained moisture prior to soldering the components to a circuit board. Baking and drying are synonymous as used herein. The baking conditions vary with the application, and are generally divided into low temperature baking and high temperature baking. See R. Prasad, Surface Mount Technology: Principles and Practice pp. 190–92 (1989), the entire contents of which is hereby incorporated by reference. Low temperature baking typically occurs at a temperature of approximately 40° C. (±5°) at less than 5% relative humidity for a minimum period of 192 hours (8 days). Because of the extended time period required for effective low temperature baking, high temperature baking is generally preferred. High temperature baking typically occurs at a temperature of 125° C. (±5°) at less than 50% relative humidity for a period of approximately 24 hours. The duration and temperature may vary from the illustrative ranges described above depending on the construction of the components, the amount of moisture present, and other operating conditions.

Components are presently baked in temperature resistant trays or tubes to remove excess moisture and then loaded into carrier tapes for storage and delivery. It would be desirable to dry the components within the carrier tape, to eliminate the intermediate processing step of loading and unloading the components from the baking trays or tubes for baking in the oven. However, carrier tapes constructed of conventional materials are generally not suitable for high temperature baking because the carrier tape and cover strip may begin to degrade at elevated temperatures. Degradation of the carrier tape may cause warping, shrinkage, or other undesirable effects that could prevent the carrier tape from being used effectively. For example, if the floor or walls of the pocket deform due to high baking temperatures, an electronic component may shift within the pocket and prevent the placement machine from grasping the component. Alternately, the cover strip could become pliable or change shape when it is heated, and could perhaps become adhered to the components within the pockets. The components may become damaged in an attempt to remove them from the cover strip, thereby rendering the components and carrier tape useless and resulting in a substantial loss for the packager.

Even if a heat-resistant carrier tape and cover strip are provided, another difficulty has been shown to render in situ baking undesirable. The adhesive that bonds the cover strip to the carrier tape tends to form a strong bond between the cover strip and the carrier tape when it is exposed to high temperatures. That is, the adhesive bonds the cover strip to the carrier tape so effectively that facile removal of the cover strip becomes difficult or impossible. For example, the cover strip may release only after the application of high peel forces, which can dislodge components that are in uncovered pockets. Alternatively, the high peel forces may cause the cover strip to tear, which could require the production line to halt in order to reattach the cover strip to the stripper assembly. Although the temperature of the baking step could be reduced in an attempt to prevent the overbonding problem, the time necessary to evaporate extant moisture correspondingly increases as described above, which slows the production process.

In view of the disadvantages of conventional carrier tapes, it is therefore desirable to provide a carrier tape and cover strip for electronic components that can withstand the temperatures encountered during the drying process and yet allow for facile removal of the cover strip to provide access to the contents of the pockets.

SUMMARY OF THE INVENTION

According to the present invention, there is provided a unitary flexible carrier tape for storage and seriatim delivery of electronic components by an advancement mechanism. The carrier tape includes a top surface having first and second parallel longitudinal edge surfaces, with at least one of the edge surfaces including means for engaging the advancement mechanism. The carrier tape also includes a plurality of pockets depending downwardly from the top surface between the edge surfaces and along the length of the carrier tape for containing the electronic components. A flexible elongate cover strip is provided to overlie the pockets, and it extends along the length of the carrier tape. The cover strip includes first and second parallel longitudinal bonding portions bonded to the first and second longitudinal edge surfaces, respectively, and a medial portion between the longitudinal bonding portions. The cover strip also includes separation means for enabling progressive separation of the medial portion of the cover strip overlying the pockets from the first and second bonding portions along a pair of longitudinal tear lines to provide access to the pockets. In addition, the cover strip includes means, positioned on at least one of the longitudinal bonding porions of the cover strip, for providing a predetermined direction of tear in the bonding portions to initiate a tear along each of the longitudinal tear lines when said cover strip is removed from the top surface. In one embodiment the means for providing a predetermined direction of tear includes nicks or slits extending inward from a peripheral edge of the cover strip towards the medial portion.

The present invention also contemplates a flexible elongate cover strip for a carrier tape having a top surface having first and second parallel longitudinal edge surfaces and a plurality of pockets formed in the top surface between the edge surfaces and along the length of the carrier tape for containing electronic components. The cover strip is adapted to overlie the pockets and to extend along the length of the carrier tape, and includes a medial portion and first and second parallel longitudinal bonding portions adapted for bonding to the first and second longitudinal edge surfaces, respectively. The cover strip further includes means for enabling separation of the medial portion overlying the pockets from the first and second bonding portions when the bonding portions are bonded to the edge surfaces to provide access to the contents of the pockets. The cover strip also includes means, positioned on at least one of the longitudinal bonding porions of the cover strip, for providing a predetermined direction of tear in the bonding portions to initiate a tear along each of the longitudinal tear lines when said cover strip is removed from the top surface. In one embodiment the directional tear means includes nicks or slits extending inward from a peripheral edge of the cover strip towards the medial portion.

BRIEF DESCRIPTION OF THE DRAWINGS

The invention will be more readily understood with reference to the accompanying drawings, wherein like reference numerals refer to like components throughout the several views, and wherein.

DETAILED DESCRIPTION OF THE PREFERRED EMBODIMENTS

The present invention relates broadly to a carrier tape having a plurality of pockets formed therein. A unitary flexible carrier tape 100 having a strip portion 102 defining a top surface is shown in FIGS. 2 through 9. Strip portion 102 includes longitudinal edge surfaces 104 and 106, and a row of aligned advancement holes 108 and 110 formed in and extending along one or both edge surfaces. Advancement holes 108 and 110 are adapted for engagement with an advancement mechanism, as shown in FIG. 1. The advancement mechanism typically comprises one sprocket for each row of advancement holes, and the teeth of each sprocket engage the holes to advance the carrier tape toward a predetermined point, at which point the robotic placement machine may grasp the individual electronic components seriatim. The holes and the spacing between adjacent holes may be varied to accommodate different types of advancement mechanisms. In one embodiment, the holes measure approximately 1.55 mm (0.061") in diameter and are regularly spaced at a distance of approximately 4 mm (0.16") on center.

Figure 2:
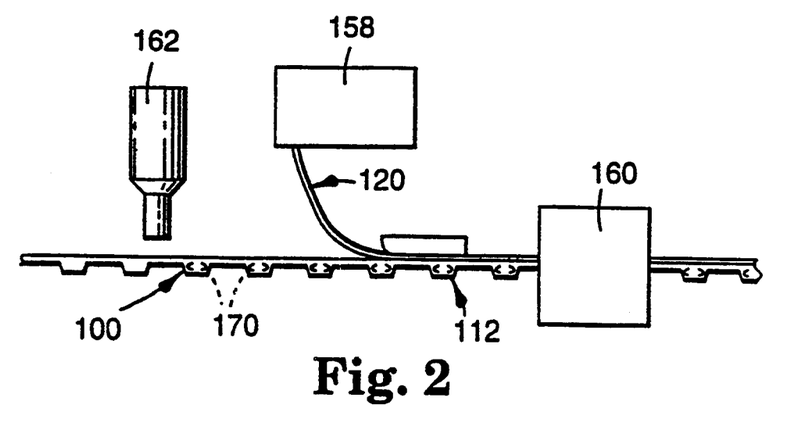
FIG. 2 is a schematic representation of a carrier tape being loaded with electronic components, having a cover strip applied, and being dried in an oven.
Figure 9:
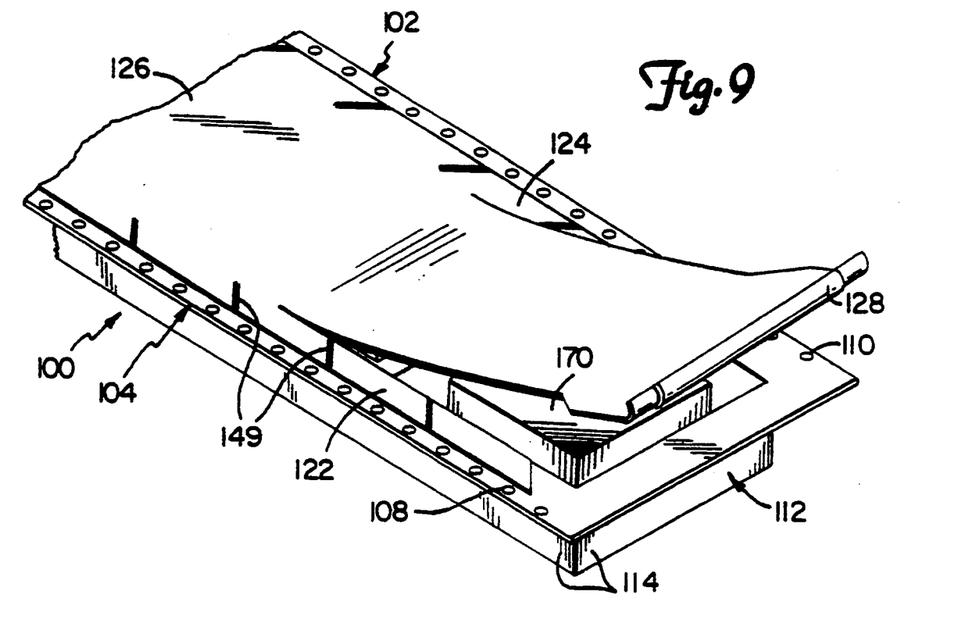
FIG. 9 is a perspective view of a sixth embodiment of a carrier tape and cover strip according to the present invention.

Pockets 112 are formed in and spaced along strip portion 102 in one or more aligned rows, as shown in FIGS. 2 and 9. In the illustrated embodiment, each pocket includes four side walls 114 each at generally right angles with respect to each adjacent wall. Side walls 114 join and extend downwardly from the top surface of the strip portion, and join bottom wall 116 to form pocket 112. Bottom wall 116 is generally planar and parallel to the plane of strip portion 102. Each wall may also be formed with a slight draft (i.e. a 2° to 12° slant toward the center of the pocket) in order to facilitate insertion of the component, and to assist in releasing the pocket from a forming die during fabrication of the carrier tape. It is also within the range of equivalents of the present invention to provide a pocket having more or less walls than the four that are shown with reference to the preferred embodiment.

Pockets 112 are designed to conform to the size of the electronic components. Two or more columns of pockets could also be formed along the length of the carrier tape in order to facilitate the simultaneous delivery of multiple components. It is believed that a carrier tape including pockets having a longitudinal axis that extends transverse to the longitudinal axis of the tape may be more effectively rolled about a core to form a roll for storage and shipment, without bending of or damage to the pockets or the components.

In another embodiment, bottom wall 116 may comprise a lower cover strip (not shown) that is applied to form a flat-punch carrier tape. A flat-punch carrier tape includes a strip portion having a thickness slightly greater than the height of the components to be carried therein, and having holes punched therethrough corresponding to the size of the desired pocket. A lower cover strip that is applied to the bottom of the carrier tape provides bottom walls for each of the pockets. Thus, the lower cover strip adjoins the side walls to form the pocket, and an upper cover strip may be sealed over the pockets to contain the components within the pockets in the manner previously described.

A particularly advantageous feature of the present invention is provided by the cover strip 120. Cover strip 120 is applied over the pockets of the carrier tape to contain the components therein. As shown in FIGS. 3 through 9, flexible, elongate cover strip 120 overlies part or all of pockets 112, and is disposed between the rows of advancement holes 108 and 110 along the length of carrier tape 100. Cover strip 120 includes parallel longitudinal bonding portions 122 and 124 that are bonded to longitudinal edge surfaces 104 and 106, respectively, of carrier tape 100. For example, a pressure sensitive adhesive, or a heat-activated adhesive such as an ethylene vinyl acetate (EVA) copolymer may be used to adhere the cover strip to edge surfaces 104 and 106.

Figure 3:
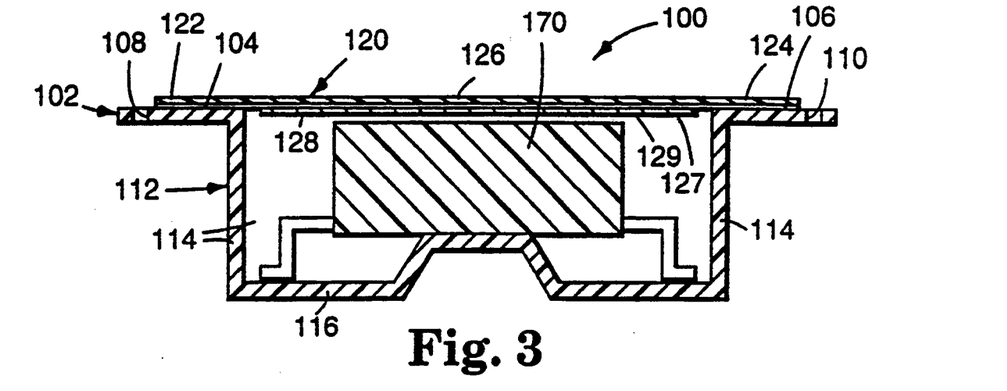
FIG. 3 is a cross-sectional view of a first embodiment of a carrier tape and cover strip according to the present invention.
Figure 4:
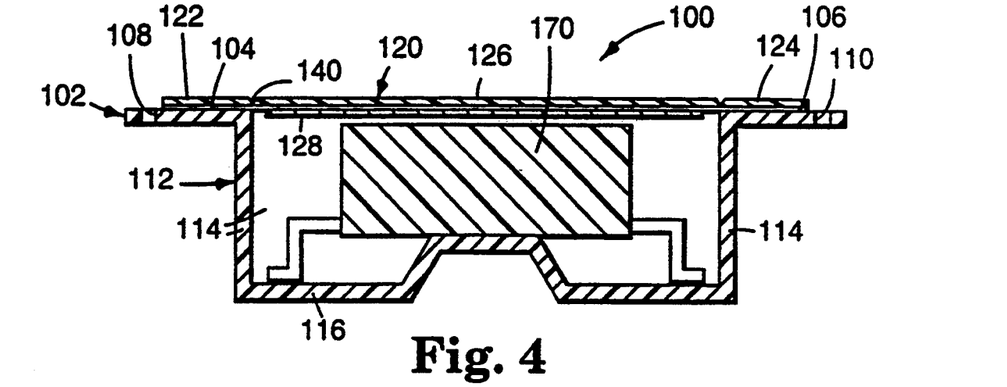
FIG. 4 is a cross-sectional view of a second embodiment of a carrier tape and cover strip according to the present invention.
Figure 5:
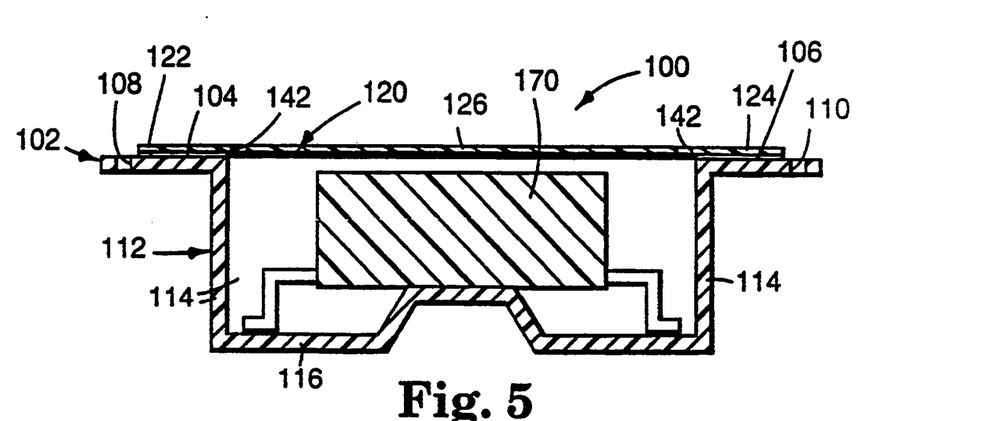
FIG. 5 is a cross-sectional view of a third embodiment of a carrier tape and cover strip according to the present invention.
Figure 6:
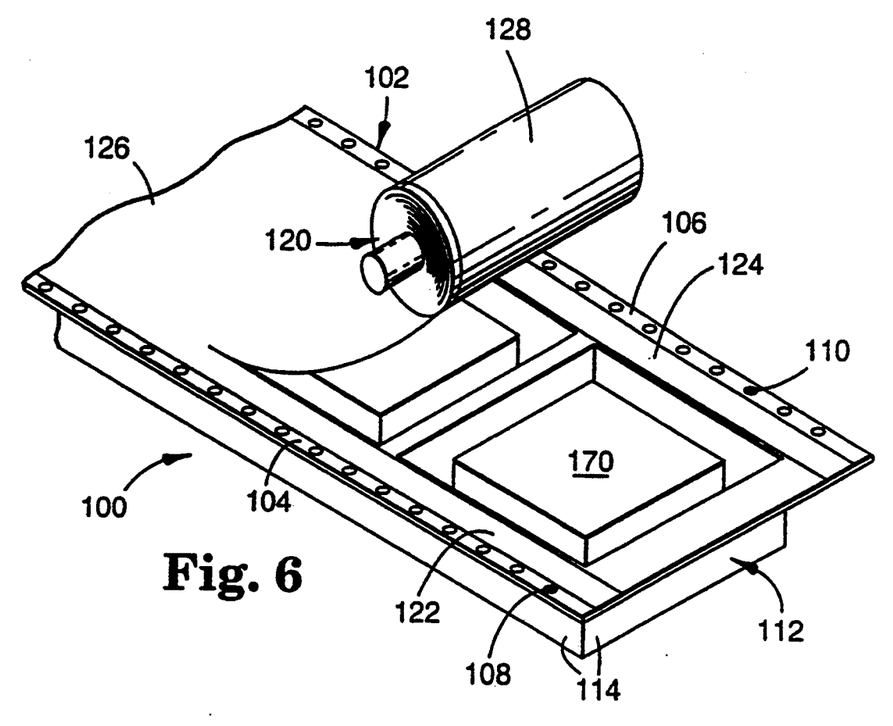
FIG. 6 is a perspective view of a carrier tape and cover strip according to the present invention, wherein a medial portion of the cover strip is being removed to expose the contents of the pockets.

Cover strip 120 also includes means for enabling separation of a medial portion 126 of cover strip 120 overlying the pockets from bonding portions 122 and 124 to provide access to the contents of the pockets. In the preferred embodiment, separation means includes a tear strip 128 applied over medial portion 126 along the length of cover strip 120, as shown in FIG. 3. Cover strip 120 is preferably constructed of a uniaxially or biaxially oriented film to facilitate downweb tearing, and to reduce or prevent transverse tearing. Tear strip 128 is resistant to tearing, and thus medial portion 126 of cover strip 120 may be peeled away from carrier tape 100, leaving bonding portions 122 and 124 attached to edge surfaces 104 and 106. Bonding portions 122 and 124 remain affixed to edge surfaces 104 and 106 due to the initial bonding of the cover strip to the carrier tape, or due to the heat encountered when the carrier tape and components are dried within an oven. Tear strip 128 also assists in guiding the propagation of opposed longitudinal tears in cover strip 120 between tear strip 128 and bonding portions 122 and 124, which exposes the contents of pockets 112.

Tear strip 128 is preferably constructed of a material such as polyester, and may be bonded to the interior surface (facing the interior of the pockets) or the exterior surface of cover strip 120. Tear strip 128 may be used to assist in separating medial portion 126 from bonding portions 122 and 124, as described above, but may also prevent electronic components from adhering to an exposed adhesive surface of cover strip 120, if such a surface faces the components. In essence, tear strip 128 acts as a deadening layer to protect the components from contacting an exposed adhesive surface.

Tear strip 128 may be provided with a metallized layer 127 on either the interior or exterior surface or both, for dissipating electricity (such as static electricity) that may be applied to the cover strip. A metallized layer may also be applied to the cover strip or to the carrier tape. The metallized layer could comprise metals such as aluminum, stainless steel, or nickel-cadmium, which are applied to the tear strip by vapor coating or sputtering. An abrasion resistant coating 129 may be applied over the metallized layer or layers to prevent scratching or damage, which could inhibit the electrical dissipation capacity of the metallized layer. The abrasion resistant coating 129 may be provided by applying a cross-linkable acrylic material to the metallized layer, and curing the material using UV or E-beam radiation.

In another embodiment, the means for enabling separation comprises parallel lines of weakness formed in cover strip 120. Lines of weakness could comprise aligned slits, a score line having a thickness that is less than the remainder of cover strip 120 (as shown at 140 in FIG. 4), or perforations (as shown at 142 in FIG. 5). Thus when cover strip 120 is peeled from carrier tape 100, medial portion 126 is separated from bonding portions 122 and 124 along the lines of weakness, thereby exposing pockets 112. Bonding portions 122 and 124 thus remain bonded to longitudinal edge surfaces 104 and 106, respectively.

In some circumstances it is desirable to cut either or both the carrier tape and the cover strip. This occurs, for example, if the carrier tape is to be removed from the advancement mechanism during the process of removing the components from the pockets. If the carrier tape has been cut and is then reinserted into the advancement mechanism at a later time, cover strip 120 will again have to be initially separated from strip portion 102 and the means for enabling separation of the medial portion from the bonding portions again initiated. In fact, whenever cover strip 120 is initially separated from the carrier tape the means for enabling separation of the medial portion must be initiated.

Figure 7:
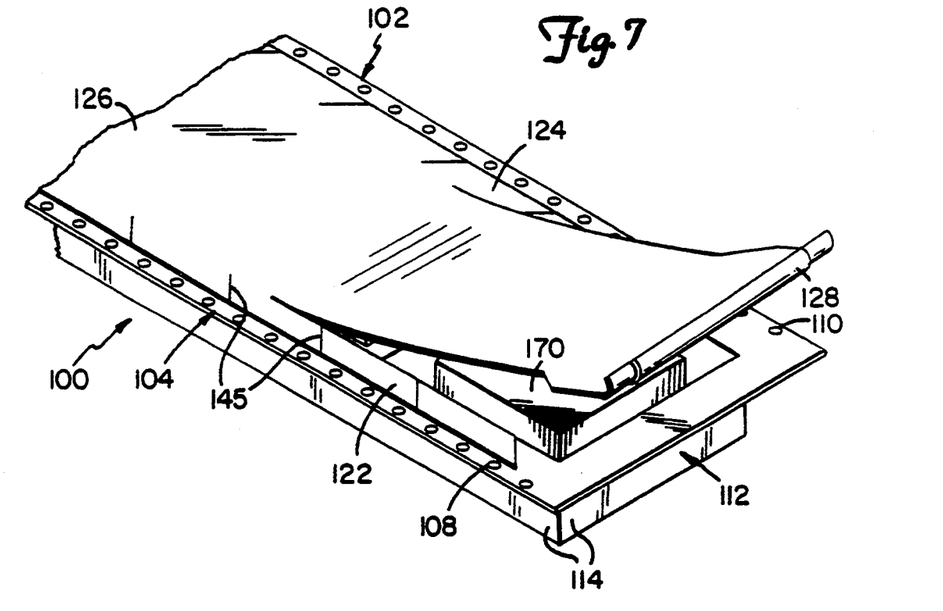
FIG. 7 is a perspective view of a fourth embodiment of a carrier tape and cover strip according to the present invention.

In order to separate medial portion 126 from bonding portions 122 and 124, cover strip 120 includes means for providing a predetermined direction of tear in the bonding portions to initiate a tear along each of the longitudinal tear lines when the cover strip is first removed from carrier tape 100. In the preferred embodiment, the predetermined directional tear means includes nicks or slits 145 spaced apart equidistantly from each other in bonding portions 122 and 124 of the cover strip, as shown in FIG. 7. Slits 145 extend inward from the peripheral edges of the bonding portions towards the medial portion and are preferably angled less than 90 degrees with respect to the peripheral edge in the direction of removal of the cover strip. Although the slits are interspersed throughout the entire longitudinal bonding portions so that the carrier tape can be cut at any point and removed from the advancement mechanism and then reinserted at a later time, the preferred spacing between the slits in between 4 mm (0.157 inches) and 254 mm (10 inches).

Figure 8:
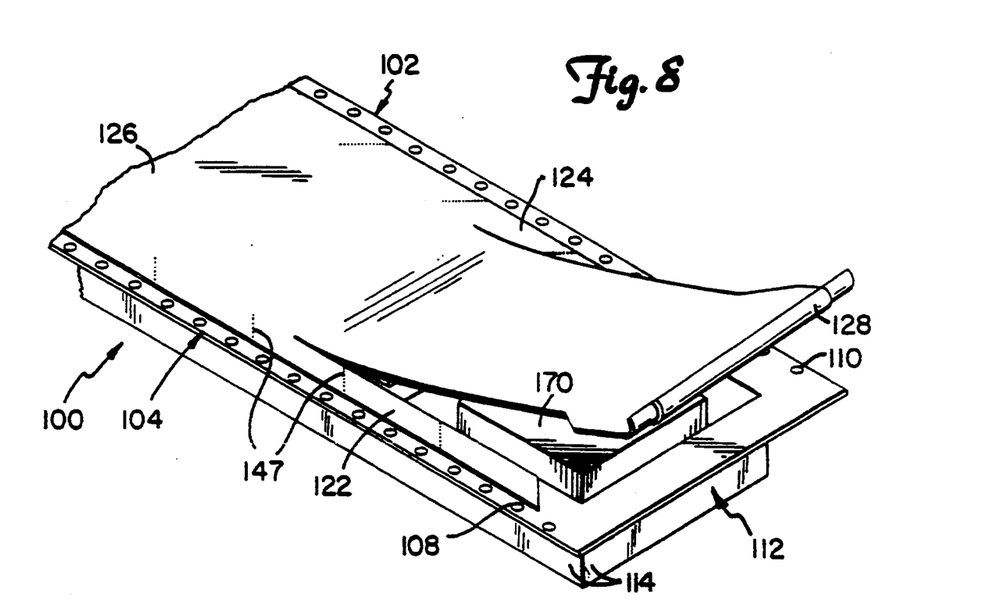
FIG. 8 is a perspective view of a fifth embodiment of a carrier tape and cover strip according to the present invention.

As shown in FIGS. 7-9, when the cover strip is initially peeled from the carrier tape, bonding portions 122 and 124 are pulled away with medial portion 126. As the cover strip continues to be pulled the tear force or tension in the cover strip is redirected at slits 145 to the longitudinal tear lines separating bonding portions 122 and 124 from medial portion 126, so that the bonding portions are no longer separated from the carrier tape. In order to assure a redirection of the tear forces, the length of each slit should extend from the peripheral edge of the bonding portions to the longitudinal tear lines which separate the bonding portions from the medial portion. However, to prevent accidental tearing of medial portion 126 or tear strip 128, the slits should not extend into the medial portion. In one embodiment, where the width of the cover strip is 5.4 mm (0.213 inches) and the width of each bonding portion is 0.665 mm (0.02618 inches), the length of each slit is 0.66 mm (0.02598 inches) at an angle of 45 degrees. Of course, as the width of the cover increases the width of the bonding portions and slits 145 also increases.

In other embodiments, the predetermined directional tear means can be any type of line or area of weakness in the longitudinal bonding sections which would redirect the tear force to initiate a tear in the longitudinal tear lines. For example, lines of weakness could include lines of perforations (as shown at 147 in FIG. 8), or score lines having a thickness that is less than the remainder of the cover strip (as shown at 149 in FIG. 9). The lines of weakness may also be formed by alternating the width of the cover strip in two or more steps (not shown) such that at the top of each step the tear force would be redirected inward toward the longitudinal tear lines. Areas of weakness may be formed by providing a series of wedges or triangular cut-outs along he peripheral edge of the longitudinal landing sections. If wedges are provided, then the edges of the wedge may be less than or equal to 90°.

Although the cover strip and means for enabling separation of a medial portion of the cover strip from the bonding portions of the cover strip have primary applicability in the area of oven-baked carrier tapes, the present invention has utility with carrier tapes generally. The means for enabling separation may also be applied to conventional carrier tapes to provide the separation characteristics described above. In the case of conventional carrier tapes that are not subjected to heating during a drying process, the medial layer may be separated from the bonding portions in the manner described herein, or the entire cover strip may be removed by conventional separation of the bonding portions from the edge surfaces. Thus the present invention should be understood to include carrier tapes generally, as well as the specific area of oven-baked carrier tapes.

The carrier tape of the present invention could also include pockets formed in multiple columns extending along the length of the carrier tape. Cover strip 120 could be adapted to include a bonding portion between each pair of aligned columns, to enable separation of a medial portion from between each pair of bonding portions to expose the pockets.

In general, the carrier tape of the present invention is made by thermoforming pockets in a sheet of polymeric material. The polymeric sheet may be made from many different materials including, but not limited to polyester, polycarbonate, polypropylene, polystyrene, PVC (polyvinyl chloride), and ABS (acrylonitrile-butadiene-styrene) copolymers. The material from which the carrier tape is constructed is preferably resistant to the deleterious effects of the heat applied during the drying process. As used herein, "deleterious effects of heating" include any significant change in the useful properties of the carrier tape or cover strip, including but not limited to embrittlement, warping, shrinkage, discoloration, and the like.

In the preferred embodiment, the polymeric sheet is electrically dissipative, and may include an electrically conductive material, such as carbon black, which is either interspersed within the material comprising the polymeric sheet, or is coated on the carrier tape either before or after the tape is formed. The electrically conductive material allows an electric charge to dissipate throughout the carrier tape and preferably to the ground. This feature may prevent damage to the components contained within the carrier tape due to an electric charge in much the same manner as the metallized layer previously described.

The polymeric sheet is supplied, either in roll form, sheet form, by continuous injection molding, or by extrusion, and conveyed to a heater, where the sheet is heated sufficiently to permit thermoforming. The temperature to which the polymeric sheet must be heated varies over a broad range depending on the gauge and type of material that is being thermoformed. Following heating, the sheet member is thermoformed by a die or dies that shape the pocket to conform to the size of the electronic component to be carried therein. The carrier tape is typically cooled after thermoforming until the polymeric material solidifies. Advancement holes are punched into the carrier tape, and any excess material, known as weed, is cut from the edges of the carrier tape to conform the carrier tape to industry standards.

As shown in FIG. 2, the formed carrier tape is loaded with components 170 by loader 162, and a cover strip 120 according to the present invention is applied by strip applicator 158 and bonded to the longitudinal edge surfaces of carrier tape 100. The loaded carrier tape may be concentrically wound about a core for storage and delivery. If the carrier tape is wound on a reel, the reel should also be resistant to the deleterious effects of high-temperature baking. The formation and loading steps associated with the carrier tape are generally known in the art, and are therefore not described in further detail herein.

After the carrier tape has been loaded and sealed with the cover strip, it is dried in oven 160. Because higher temperatures result in shorter baking times, it is desirable to bake the loaded carrier tape at a relatively high temperature (e.g. 125° C. (257° F.)) to expedite the production process. The duration of the baking step depends on the level of entrained moisture in the component, the relative humidity in the oven, and the acceptable level of entrained moisture in the component after baking. As with high temperature baking processes of the prior art, the duration may be approximately twenty-four hours. After the drying step, the carrier tape is typically loaded into a sealed, desiccated container for shipment and storage of the carrier tape and components.

In use, the carrier tape is unloaded as shown with respect to the prior art in FIG. 1. As illustrated in FIGS. 6-9, cover strip 120 is peeled from carrier tape 100. The predetermined directional means, such as slits 145, lines of perforations 147, or lines of weakness 149, initiate a tear along longitudinal tear lines to separate the medial portion 126 of cover strip 120 from bonding portions 122 and 124 to expose components 170 within pockets 112. The bonding portions then remain adhered to the edge surfaces of carrier tape 100, and medial portion 126 may be rolled onto a take-up reel for disposal.

The present invention has now been described with reference to several embodiments thereof. It will be apparent to those skilled in the art that many changes can be made in the embodiments described without departing from the scope of the invention. For instance, other materials that are resistant to the effects of heat may be used to construct the carrier tape or cover strip or both. The carrier tape of the present invention could also be modified to incorporate two or more parallel cover strips, each of which comprises outer bonding portions and a medial portion, and each of which is bonded over a column of pockets. Hence, the scope of the present invention shall not be limited by the structures described herein, but only by structures described by the language of the claims and the equivalents of those structures.

Although the present invention has been described with reference to preferred embodiments, workers skilled in the art will recognize that changes may be made in form and detail without departing from the spirit and scope of the invention.

What is claimed is:

1. A unitary, flexible carrier tape for storage and seriatim delivery of electronic components by an advancement mechanism, the carrier tape comprising:
   a top surface having first and second parallel longitudinal edge surfaces, at least one of said edge surfaces including means for engaging the advancement mechanism;
   a plurality of pockets depending downwardly from said top surface between said edge surfaces and along the length of the carrier tape for containing the electronic components;
   a flexible elongate cover strip overlying said pockets and extending along the length of the carrier tape, said cover strip having first and second parallel longitudinal bonding portions bonded to said first and second longitudinal edge surfaces, respectively, and a medial portion between said bonding portions and overlying said pockets;
   separation means for enabling progressive separation of said medial portion of said cover strip from said bonding portions of said cover strip along a pair of longitudinal tear lines to provide access to the pockets; and
   means, positioned on at least one of said longitudinal bonding portions of said cover strip, for providing a predetermined direction of tear in said bonding portions to initiate a tear along each of said longitudinal tear lines when said cover strip is removed from said top surface.

2. The carrier tape of claim 1, wherein said means for providing a predetermined direction of tear comprises nicks in at least one peripheral edge of said cover strip and wherein each of said nicks extends inward toward said medial portion.

3. The carrier tape of claim 2, wherein each of said nicks are angled less than 90 degrees with respect to a peripheral edge of said cover strip.

4. The carrier tape of claim 3, wherein each of said nicks extends inward from the peripheral edge of said cover strip in the direction of removal of said medial portion.

5. The carrier tape of claim 1, wherein said means for providing a predetermined direction of tear comprises lines of perforations formed in said longitudinal bonding portions of said cover strip.

6. The carrier tape of claim 1, wherein said means for providing a predetermined direction of tear comprises lines of weakness formed in said longitudinal bonding portions of said cover strip.

7. The carrier tape of claim 1, wherein said carrier tape and said cover strip are constructed of a material resistant to the deleterious effects of heating to a temperature of approximately 125° C.

8. The carrier tape of claim 1, wherein said carrier tape comprises polycarbonate and said cover strip comprises polyester.

9. A unitary, flexible carrier tape comprising:
   a top surface having first and second parallel longitudinal edge surfaces;
   a plurality of pockets depending downwardly from said top surface between said edge surfaces and along the length of the carrier tape;
   a flexible elongate cover strip overlying said pockets and extending along the length of the carrier tape, said cover strip having first and second parallel longitudinal bonding portions bonded to said first and second longitudinal edge surfaces, respectively, and a medial portion between said bonding portions and overlying said pockets;
   separation and removal means for enabling progressive separation and removal of said medial portion of said cover strip overlying said pockets from said first and second bonding portions to provide access to said pockets; and
   initiating means for initiating said separation and removal means for removal of a medial portion of said cover strip, said initiating means being positioned on at least one of said longitudinal bonding porions of said cover strip.

10. The carrier tape of claim 9, wherein said initiating means comprises nicks in at least one peripheral edge of said cover strip wherein each of said nicks extends inward toward said medial portion to provide a predetermined direction of tear in said bonding portions to initial a longitudinal tear between said medial portion and said bonding portions.

11. The carrier tape of claim 10, wherein each of said nicks are angled less than 90 degrees with respect to a peripheral edge of said cover strip.

12. The carrier tape of claim 11, wherein each of said nicks extends inward from the peripheral edge of said cover strip in the direction of removal of said medial portion.

13. The carrier tape of claim 9, wherein said initiating means comprises lines of perforations formed in said longitudinal bonding portions of said cover strip to provide a predetermined direction of tear in said bonding portions to initial a longitudinal tear between said medial portion and said bonding portions.

14. The carrier tape of claim 9, wherein said carrier tape and said cover strip are constructed of a material resistant to the deleterious effects of heating to a temperature of approximately 125° C.

15. The carrier tape of claim 9, wherein said means for enabling separation comprises a tear strip adjoining said medial portion along the length of said cover strip to guide the propagation of opposed longitudinal tears in said cover strip between said tear strip and said respective bonding portions.

16. The carrier tape of claim 9, wherein said carrier tape is electrically dissipative.

17. The carrier tape of claim 16, wherein at least one of said tear strip and said cover strip is coated with an electrically dissipative metallic layer.

18. The carrier tape of claim 17, wherein said metallic layer is coated with an abrasion resistant coating.

19. The carrier tape of claim 9, wherein said carrier tape comprises polycarbonate and said cover strip comprises polyester.

20. The carrier tape of claim 9, wherein said means for enabling separation comprises parallel lines of weakness formed in said cover strip.

* * * * *